United States Patent [19]

Kobler

[11] 4,186,988

[45] Feb. 5, 1980

[54] ELECTRICAL CONNECTOR RECEPTACLES

[75] Inventor: Robert J. Kobler, Harrisburg, Pa.

[73] Assignee: AMP Incorporated, Harrisburg, Pa.

[21] Appl. No.: 944,095

[22] Filed: Sep. 20, 1978

[51] Int. Cl.$^2$ .............................................. H05K 1/10

[52] U.S. Cl. .......................... 339/176 MP; 339/17 C

[58] Field of Search ................ 179/1 PC; 339/176 M, 339/91 R, 125 R, 126 R, 17 R, 17 C, 17 LC, 98, 99

[56] References Cited

U.S. PATENT DOCUMENTS

| | | | |
|---|---|---|---|
| T958,009 | 5/1977 | Snyder | 339/99 R |
| 3,369,214 | 2/1968 | Krimreich et al. | 339/176 M |
| 3,850,497 | 11/1974 | Krumreich et al. | 339/126 R |
| 4,071,696 | 1/1978 | Anderson | 179/1 PC |

*Primary Examiner*—E. F. Desmond

*Attorney, Agent, or Firm*—Frederick W. Raring

[57] ABSTRACT

Electrical connector receptacle comprises an insulating housing having a rearward end, a plug-receiving end, and a plug-receiving opening extending through the housing and between the ends. A plurality of side-by-side stamped and formed conductors are mounted in the housing with intermediate portions of the conductors extending through a conductor-receiving opening which is parallel to the plug-receiving opening. First end portions of these conductors are reversely bent at the plug-receiving end and extend obliquely into the plug-receiving opening. Second end portions of the conductors extend beyond the rearward end of the housing and across an apron which is integral with the housing. This apron has conductor positioning and retaining means thereon for retaining the conductors in spaced-apart predetermined locations and for securing the conductors to the housing. An improved manufacturing method is disclosed in which all of the conductors are assembled to the housing simultaneously.

6 Claims, 11 Drawing Figures

ELECTRICAL CONNECTOR RECEPTACLES

FIELD OF THE INVENTION

This invention relates to electrical connector receptacles of a type which are intended to receive connector plugs.

BACKGROUND OF THE INVENTION

U.S. Pat. No. 3,850,497 describes in detail a connector receptacle of a type which is intended for use in the telephone industry. The receptacle described in this patent comprises an insulating housing having a plug-receiving end and a plug-receiving opening extending into the plug-receiving end. A plurality of circular openings extend through the housing from the plug-receiving end to the rearward end of the housings and contact springs extending from these circular openings diagonally into the plug-receiving opening so that when a plug is inserted into the receptacle, the contact members on the plug, will engage the contact springs. The contact springs are in the form of wires and are connected by means of crimped electrical connections to lead wires. These crimped connections are contained in the circular openings in the housing and the lead wires extend from the circular openings and away from the housing at the rearward end thereof. The commonly used type of connector plug which is intended to be mated with connector receptacles of the type described above is described in U.S. Pat. No. 3,954,320.

The connector receptacle described in U.S. Pat. No. 3,850,497 has been widely adopted in the telephone industry and it is being used to an increasing extent on equipment other than telephone equipment, for example, data processing equipment which may be installed adjacent to a telephone exchange, small computers, and similar equipment.

The use of these connector receptacles in such related equipment often requires that the receptacle be mounted on a circuit board, but the connector receptacle shown in U.S. Pat. No. 3,850,497 cannot be readily or easily connected to conductors on a circuit board. The present invention, in accordance with the aspect thereof, is directed to the achievement of a connector receptacle capable of being mated with connector plugs of the type shown in U.S. Pat. No. 3,954,320 and which can be mounted on a circuit board with the conductors in the receptacle soldered directly to the conductors on the circuit board.

The wire spring contacts used in connector receptacles of the type shown in U.S. Pat. No. 3,850,497 engage the terminals in a plug connector only along a single line of electrical contact and while this contact arrangement is entirely satisfactory for voice signals, it would be desirable to provide greater contact area in connectors used under other circumstances. The present invention is therefore directed to the achievement of a connector of the general type shown in U.S. Pat. No. 3,850,497 having stamped and formed contact members which provide a substantial area of contact with the terminals of an inserted plug.

The invention is also directed to the achievement of an improved manufacturing method for connectors of the type shown in U.S. Pat. No. 3,850,497 and particularly an improved method of assembling the conductors (spring contacts and adjacent conductors) to the connector housing which avoids the necessity of forming a crimped connection to a contact spring wire.

The herein disclosed embodiment of the invention comprises an insulating housing having a plug-receiving end, a rearward end and having a plug-receiving opening extending into the plug-receiving end. A conductor-receiving opening extends through the housing parallel to, and adjacent to, the plug-receiving opening and stamped and formed conductors contained in the housing have intermediate portions disposed in this opening. First end portions of the conductors are reversely bent at the plug-receiving end and extend diagonally into the plug-receiving opening so that they will engage complementary terminals in a connector plug upon insertion of the plug into the plug-receiving opening. The other ends of the conductors extend from the conductor-receiving opening at the rearward end of the housing and across an apron which is integral with, and which extends from, the rearward end of the housing. This apron has positioning and retaining means thereon which serves precisely to locate the conductors and to prevent the intermediate portions of the conductors in the conductor-receiving opening from moving laterally.

Connector receptacles in accordance with the invention are manufactured by providing a housing as a one-piece injection molded part and manufacturing the terminals in the form of a continuous strip with the terminals extending in side-by-side relationship between two carrier strips. The terminals are assembled to the housing by cutting off a section of the continuous strip (including the carrier strips) and inserting the terminals of the section through the conductor-receiving opening in the housing. The carrier strips are then severed from the conductors and the first end portions of the conductors are reversely bent so that they extend into the plug-receiving opening. The remaining ends, the second ends, of the conductors are formed and engaged with the conductor positioning and retaining means on the apron so that they will be retained in precise locations in, and on, the housing.

Figures 1, 2:
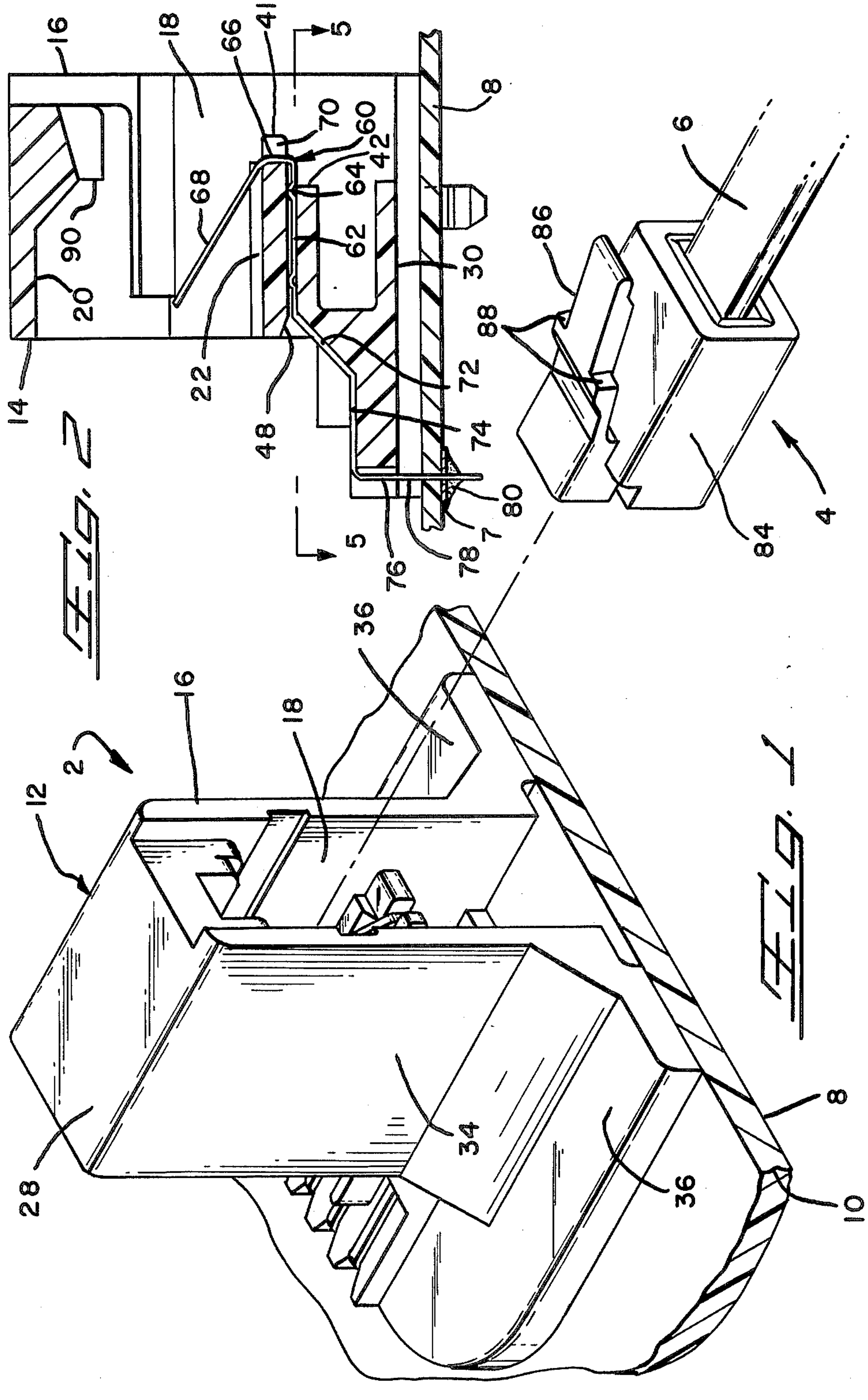
FIG. 1 is a fragmentary perspective view of a connector receptacle in accordance with the invention mounted on a printed circuit board and showing a connector plug positioned for insertion into the receptacle.
FIG. 2 is a sectional side view of the connector receptacle.
Figure 3:
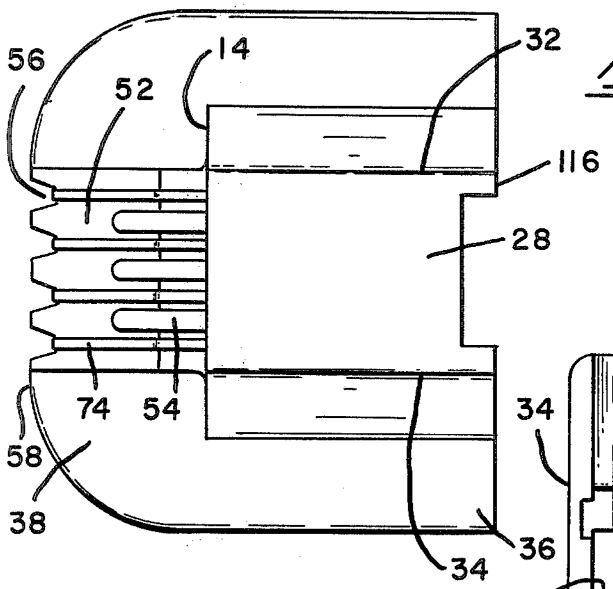
FIG. 3 is a top plan view of the connector receptacle.
Figure 4:
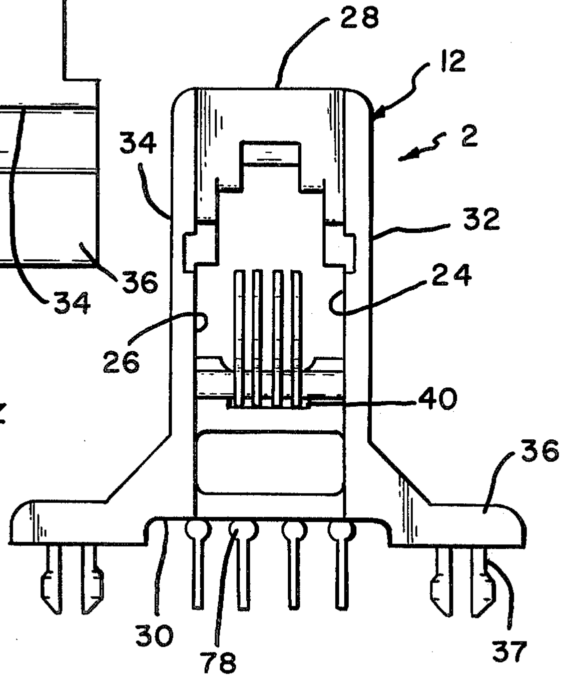
FIG. 4 is a front view of the connector receptacle.
Figure 5:
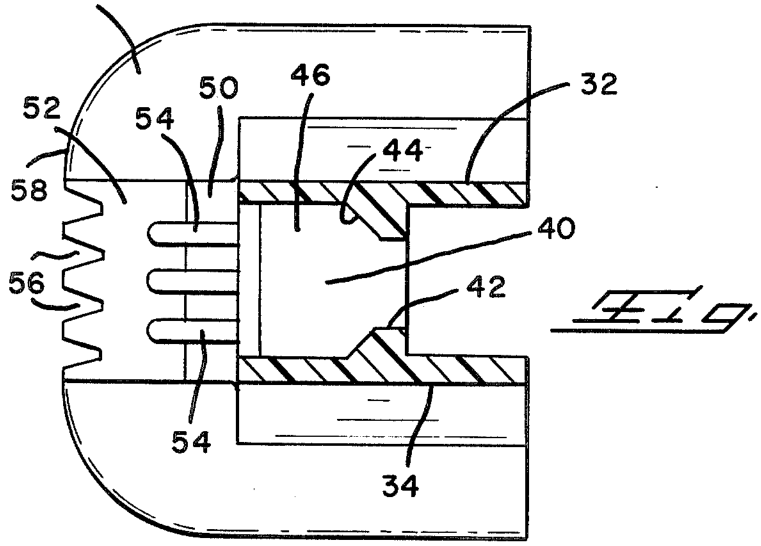
FIG. 5 is a view taken along the lines 5—5 of FIG. 4.

Disclosed Embodiment:

As shown in FIG. 1, the connector receptacle 2 in accordance with the invention is adapted to receive a plug 4 and serves to connect conductors in a cable 6 extending to the plug to conductors 7 on the underside 8 of a printed circuit board 10. The receptacle 2 comprises an insulating housing 12 of suitable plastic material, such as a filled nylon, having a rearward end 14, a plug-receiving end 16, and a plug-receiving opening 18 extending through the housing and between the ends. The opening 18 has upper and lower (as viewed in the drawing) internal sidewalls 20, 22 and internal endwalls 24, 26. The housing has external sidewalls 28, 30, external endwalls 32, 34, and support feet 36 which extend outwardly from the external endwalls 32, 34. These support feet are provided with locking lugs 37 on their undersides which are dimensioned to be received in holes in the circuit board 10 to retain the housing on the circuit board prior to soldering of the conductors in the housing to the conductors of the circuit board. The external sidewall 30 is supported above the surface of the board by the feet 36 to facilitate the soldering operation.

A conductor-receiving opening 40 extends through the housing parallel to, and adjacent to, the plug-receiving opening 18 and between the internal sidewall 22 and the adjacent external sidewall 30. This conductor-receiving opening extends rearwardly through a recessed surface 42 which is below the portion 41 of the plug-receiving end which is adjacent to the internal sidewall 22. The entrance to opening 40 in surface 42 is of restricted width and the sides of the opening 40 diverge as shown at 44. The divergent portion of the opening merges with a wide portion 46 which extends to the rearward end 14 of the housing. The entrance 48 at this rearward end is enlarged, as shown in FIG. 2, to facilitate assembling of the conductors to the housing, as will be described below.

A downwardly inclined ramp 50 extends from a rearward entrance 48 of the opening 40 to the upper surface 52 of the previously identified apron 38 and spaced-apart barriers 54 are provided on the ramp and on this surface to define separate stalls for each of the conductors in the housing. Additionally, spaced-apart notches 56 extend inwardly from the rearward edge 58 of the opening which notches receive the conductors with an interference fit, as will also be described below.

The conductors 60 each comprise an intermediate portion 62 which is contained in the conductor-receiving opening with a force fit provided by dimples 64 on these portions of the conductors. Adjacent to the mating end of the housing, each conductor is reversely bent, as shown at 66, the bent portions being received in spaced-apart notches 70 extending inwardly from the surface portions 41 of the plug-receiving end 16. The first end portions 68 of the conductors extend obliquely from the internal sidewall 22 into the opening 16 and serve as contact springs which are deflected by the plug when the plug is inserted into the opening 16.

The second end portions 72 of the conductors extend downwardly over the ramp 50 as shown, and across the adjacent surface 52 of the apron and downwardly, as shown at 76, through the notches 56. The notches are V-shaped, as shown, and are dimensioned to receive the conductors with an interference fit securely to anchor these ends of the conductors to the housing while the barriers 54 prevent lateral movement of the conductors towards or away from each other. The tip portions of the conductors extend downwardly beyond the sidewall 30 and are soldered at 80 to the conductors on the underside of the circuit board. Enlarged segments 78 which are provided on the conductors beneath the apron further contribute to the stability of the conductors on the housing.

Figure 6:
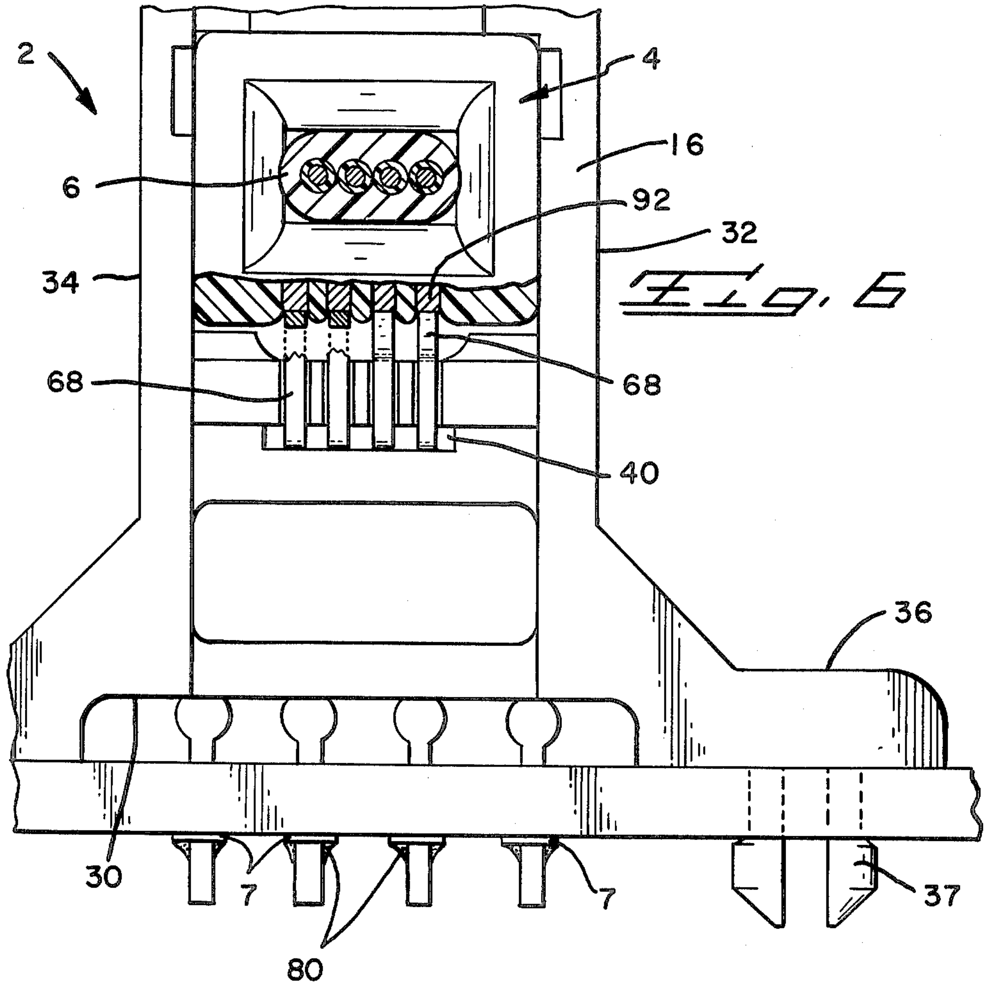
FIG. 6 is a fragmentary transverse cross-sectional view showing the manner in which the terminals in the connector plug contact the conductors in the connector receptacle.

The connector plug 4 is fully described in U.S. Pat. No. 3,954,320 and need not be described in detail here. The plug contains terminals 92 which contact the conductors in the cable so that when the plug is inserted into the opening the edges of these terminals in the plug will engage the contact springs 68, as shown in FIG. 6. The plug has a flexible retaining member 86 extending rearwardly from its foreward end and shoulders 88 on the plug are dimensioned to engage shoulders 90 in the plug-receiving opening to retain the plug in the receptacle.

Figure 7:
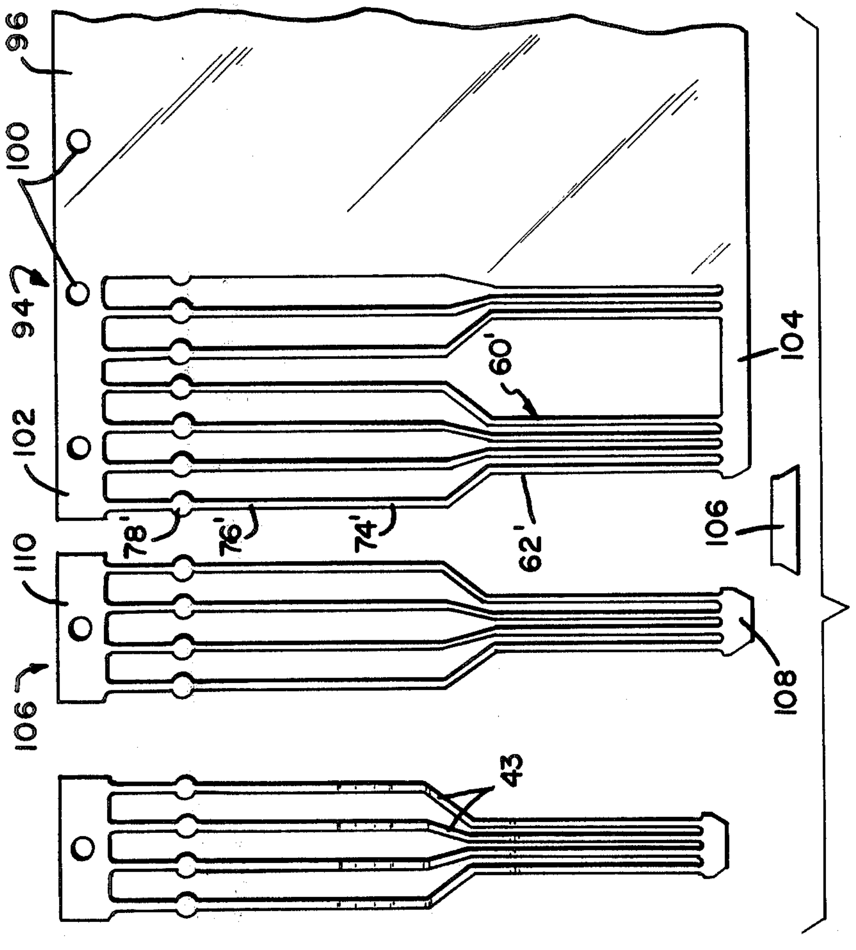
FIG. 7 is a plan view of a portion of a sheet metal strip illustrating the stamping and forming of conductor strip for the practice of the invention.

Receptacle assemblies, in accordance with the invention, are produced by manufacturing the housing of a suitable thermoplastic material in the form shown and manufacturing the conductors in the form of a strip 94 of suitable spring material, as shown in FIG. 7. The strip is manufactured by punching suitable pilot holes 100 in the edge of the strip 96 and blanking the strip to produce groups of four conductor blanks 60′ with the parts of each blank being identified with the same reference numerals, differentiated by prime marks, as those used in previous description of the conductors. The conductor blanks 60′ extend between spaced-apart carrier strips 102, 104 and the sections 106 between adjacent groups of conductors at the ends 68′ thereof are then removed, as shown in FIG. 7. The forming operation can then be carried out to produce the offset portion 74 in the conductors and to produce the dimples, or bosses 62, see FIG. 8. The finished continuous strip then comprises a single carrier strip 102 with groups of four conductors extending therefrom and with the ends of each group connected by a remanent 108 of the carrier strip 104.

Figure 10:
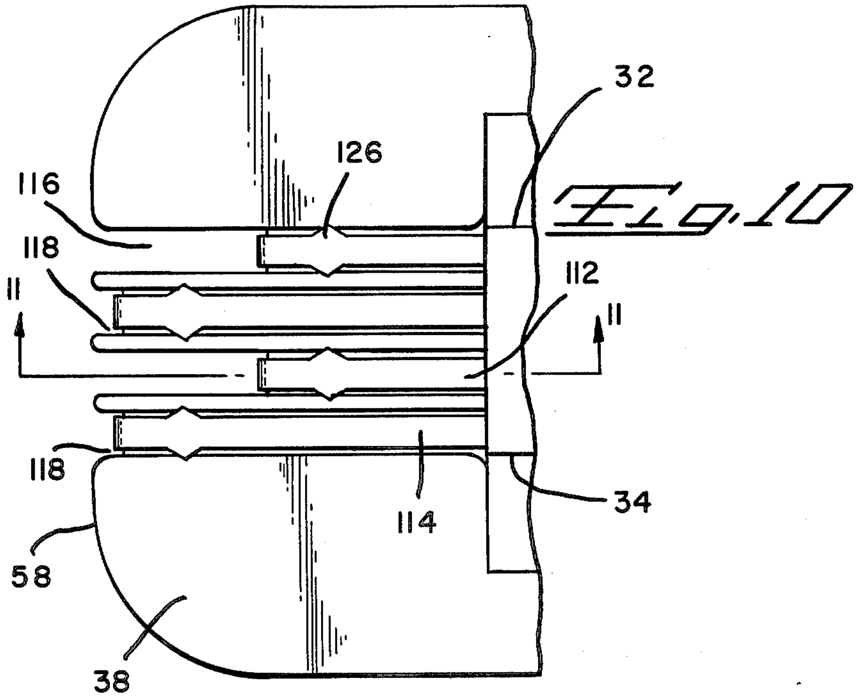
FIG. 10 is a fragmentary view of an alternative embodiment.

A group 106 of four conductors is assembled to the housing by severing a section 106 from the strip while leaving remnants of the carrier strips 102, 104 on the section, as shown at 108, 110. This section is then inserted into the rearward entrance 48 of the conductor-receiving opening until the portions 68′ of the conductors extend beyond the mating face, or plug-receiving face, of the housing, as shown in FIG. 10, with the diverging portions 73 of the conductors in the portion 46 of opening 40. Thereafter, the remnants 108 and 110 of the carrier strips are severed from the conductors and final forming of the conductors is carried out by reversely bending the first ends of the conductors so that they extend into the opening 18 and downwardly bending the second ends so that they extend over the ramp 50, across the surface 52 and through the notches 56. After the tip portions of the conductors are bent downwardly, the enlargements 78 will be located adjacent to the lower surface of the apron. These enlarged portions of the conductors assist in maintaining the conductors in their proper positions and also support the tip portions against upward movement through the notches when the tip portions are inserted into openings in the circuit board prior to soldering.

Figure 11:
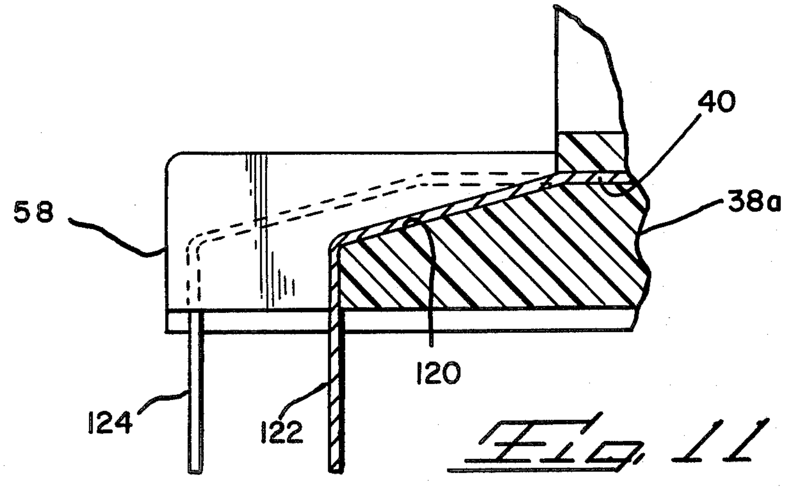
FIG. 11 is a view taken along the lines 11—11 of FIG. 10.

FIGS. 10 and 11 show an alternative embodiment in which the ends 122, 124 of the conductors 112, 114 are offset from each other so that the width of the housing at the rearward end thereof is substantially reduced. It will be appreciated that in this embodiment it is not necessary to provide the diverging intermediate sections 43 of the conductors and that the conductor-receiving opening can be of uniform width. In this embodiment, slots 116, 118 extend inwardly from the rearward edge of the apron, the slots 116 which receive the end portions of the conductors 112 being relatively deeper than the slots 118 which receive the end portions of the conductors 114. All of the slots have ramps 120 which slope downwardly from the upper surface of the apron, as shown in FIG. 11, and the conductors extend across these ramps and downwardly beyond the lower surface of the apron, as shown in FIG. 11. In this embodiment, the conductors are also provided with outwardly extending barbs 126 which gouge into the sidewalls of the slots when the conductors are assembled to the housing and assist in retaining the conductors in assembled relationship. The embodiment of FIGS. 10 and 11 can thus be used under circumstances where it is desired to have a housing of reduced width and where the printed circuit board has staggered holes therein for reception of the ends of the conductors.

Figure 9:
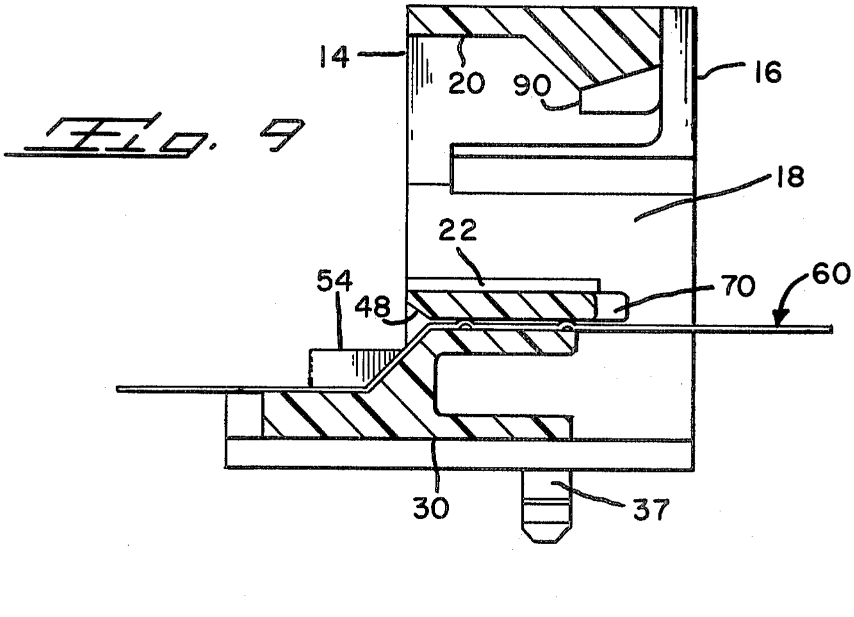
FIG. 9 is a cross-sectional view similar to FIG. 2, but showing the conductors immediately after insertion into the housing and prior to final forming.
Figure 8:
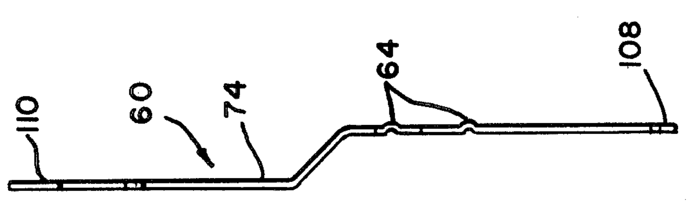
FIG. 8 shows the profile of the end of the strip.

The practice of the invention results in the achievement of a connector which can be produced at a minimum of cost by automatic assembly machinery, as will be apparent from FIGS. 7–9 and the foregoing description of the assembly process. The conductors can be produced at extremely low cost by virtue of their simplified form and the absence or elimination of the requirement of a crimped connection in the housing, as described in the above identified U.S. Pat. No. 3,850,497. Moreover, the assembly of the conductors to the housing is carried out by inserting all of the conductors in a single insertion operation, as shown in FIG. 9. The forming of the conductors after insertion can also be carried out with suitable assembly machinery and at a very low production cost.

The practice of the invention provides substantial area of contact between the conductors in the receptacle and the terminals in the plug 4, as shown in FIG. 6. The contact surface of the terminals in the plug comprises an edge of each terminal and this edge bears against the flat surfaces of the contact portions 68 of the receptacle conductors. This arrangement provides, or produces, an extremely stable electrical contact which is suitable for transmission of critical signals in that little or no noise is produced in the contact.

Finally, the practice of the invention results in the achievement of a connector receptacle having conductors therein which can be directly soldered to the conductors on a circuit board. It should be mentioned that other terminating means can be provided on the ends of the conductors which are adjacent to the apron of the housing, such as wire-receiving slots of these terminals can be formed such that they can be mated with complementary terminals on the ends of wires.

While the disclosed embodiment of the invention is intended to be mounted on a circuit board with the plug-receiving opening 18 and the conductor-receiving opening 40 extending parallel to the surface of the circuit board 10, it will be apparent that an alternative embodiment can be devised with the conductor positioning and retaining means arranged such that the housing would be adapted to be mounted on the circuit board in an orientation with the openings extending normally of the surface of the circuit board. For example, extensions can be provided on the rearward end 14 for supporting that end of the housing above the surface of the circuit board and the second end portions of the conductors formed such that they would extend into openings in the circuit board.

I claim:

1. An electrical connector receptacle of the type comprising an insulating housing having a plug-receiving end and a rearward end, a plug-receiving opening extending into said plug-receiving end, said plug-receiving opening having opposed internal sidewalls and opposed internal endwalls, said housing having oppositely directed external sidewalls and oppositely directed external endwalls, a plurality of electrical conductors in side-by-side spaced-apart relationship, each of said conductors comprising a contact spring portion extending from one of said internal sidewalls at a location adjacent to said plug-receiving end diagonally into said opening and towards the opposite internal sidewall, and each conductor having a lead portion extending from said plug-receiving end through said housing between said one internal sidewall and the adjacent external sidewall and towards said rearward end, said plug-receiving opening being dimensioned to receive a connector plug having spaced apart contact members therein which engage said contact spring portions of said conductors, said connector receptable being characterized in that:

said housing has a single conductor-receiving opening extending therethrough from said rearward end to said plug-receiving end, said conductor-receiving opening being between said one internal sidewall and said adjacent external sidewall, said opening having a width which is sufficient to receive said conductors in side-by-side coplanar relationship, said conductors being of stamped and formed sheet metal and having intermediate portions disposed in said conductor-receiving opening, said intermediate portions constituting said lead portions, said conductors having reversely bent portions at said plug-receiving end which extend from said conductor-receiving opening to said plug-receiving opening and having first end portions which extend into said plug-receiving opening, said first end portions constituting said contact spring portions, each of said conductors having a second end portion which extends beyond said rearward end, said housing having an apron extending from said rearward end between said conductor-receiving opening and said adjacent external sidewall, said conductors extending across said apron, and conductor positioning and retaining means on said apron, said conductor positioning and retaining means being effective to secure said second end portions of said conductors against lateral movement towards each other whereby, said intermediate portions, said reversely bent portions, and said first end portions of said conductors are maintained in spaced-apart relationship at predetermined locations in said conductor-receiving opening and said plug-receiving opening.

2. An electrical connector receptacle as set forth in claim 1, said conductor-receiving opening having an entrance of restricted width at said plug-receiving end of said housing, said conductor-receiving opening having a diverging portion of increasing width extending from said entrance portion towards said rearward end of said housing, said conductors being splayed in said diverging portion, said second end portions of said conductors on said apron being spaced-apart by greater distances than said first end portions.

3. An electrical connector receptacle as set forth in claim 1, said apron having edge portions which are remote from said rearward end of said housing, said edge portions having conductor-receiving notches therein, said conductors extending through said notches and beyond said adjacent external sidewall whereby said housing is adapted to be mounted on a circuit board with said conductor-receiving opening receiving parallel to said circuit board.

4. An electrical connector receptacle as set forth in either of claims 1 or 3, said conductor positioning and retaining means comprising barriers on said apron, said barriers defining stalls, said conductors being in said stalls.

5. A connector receptacle as set forth in claim 3, said positioning and retaining means comprising enlarged portions of said conductors adjacent to said notches, said enlarged portions preventing movement of said conductors through said notches.

6. A connector receptacle as set forth in claim 3, said positioning and retaining means comprising spaced-apart barriers on said apron extending from a location adjacent to said conductor-receiving opening towards said edge portions of said apron, said conductors being between adjacent barriers, said conductor positioning and retaining means further comprising enlarged portions of each of said conductors adjacent to said notches serving to prevent movement of said conductors relative to said notches.

* * * * *